United States Patent
Ikushima

(10) Patent No.: US 9,789,512 B2
(45) Date of Patent: Oct. 17, 2017

(54) LIQUID DROPLET DISCHARGE DEVICE

(71) Applicant: MUSASHI ENGINEERING, INC., Mitaka-shi, Tokyo (JP)

(72) Inventor: Kazumasa Ikushima, Mitaka (JP)

(73) Assignee: MUSASHI ENGINEERING, INC., Tokyo (JP)

( * ) Notice: Subject to any disclaimer, the term of this patent is extended or adjusted under 35 U.S.C. 154(b) by 0 days.

(21) Appl. No.: 14/917,083

(22) PCT Filed: Sep. 8, 2014

(86) PCT No.: PCT/JP2014/073668
§ 371 (c)(1),
(2) Date: Mar. 7, 2016

(87) PCT Pub. No.: WO2015/034083
PCT Pub. Date: Mar. 12, 2015

(65) Prior Publication Data
US 2016/0193624 A1 Jul. 7, 2016

(30) Foreign Application Priority Data

Sep. 9, 2013 (JP) ................................. 2013-185818

(51) Int. Cl.
*B05B 1/08* (2006.01)
*B05C 11/10* (2006.01)
(Continued)

(52) U.S. Cl.
CPC .......... *B05C 11/1034* (2013.01); *B05B 1/083* (2013.01); *B05B 17/0653* (2013.01);
(Continued)

(58) Field of Classification Search
CPC ... B05C 11/1034; B05C 5/0225; B05B 1/083; B05B 17/0653; H02N 2/043; H01L 41/083
See application file for complete search history.

(56) References Cited

U.S. PATENT DOCUMENTS 4,570,095 A * 2/1986 Uchikawa .............. H02N 2/043
310/328
4,678,100 A 7/1987 Gelinas et al.
(Continued)

FOREIGN PATENT DOCUMENTS

JP 4-365384 A 12/1992
JP 2001-503920 A 3/2001
(Continued)

OTHER PUBLICATIONS

International Search Report dated Dec. 2, 2014, issued in counterpart International Application No. PCT/JP2014/073668 (1 page).

*Primary Examiner* — Arthur O Hall
*Assistant Examiner* — Adam J Rogers
(74) *Attorney, Agent, or Firm* — Westerman, Hattori, Daniels & Adrian, LLP

(57) ABSTRACT

A liquid material is discharged in a flying mode at a high tact by moving a needle (12) at a high speed with a small-sized drive device. A liquid droplet discharge device includes a liquid chamber (51) that is communicated with a discharge opening (60), and that is supplied with the liquid material, a needle (12) having a tip that is advanced and retracted within the liquid chamber, a drive device (2) that operates the needle (12) to advance and retract, and a displacement magnifying mechanism (3), wherein liquid droplets are discharged in a flying mode from the discharge opening (60). Even number of drive devices are disposed in a left-right symmetric relation, and the displacement magnifying mechanism (3) includes an elastically deformable U-shaped member (5, 6, 7, 8, 9) having a bottom portion to which the needle (12) is coupled.

17 Claims, 11 Drawing Sheets

(51) Int. Cl.
*H02N 2/04* (2006.01)
*B05C 5/02* (2006.01)
*B05B 17/06* (2006.01)
*H01L 41/083* (2006.01)

(52) U.S. Cl.
CPC ........... *B05C 5/0225* (2013.01); *H02N 2/043* (2013.01); *H01L 41/083* (2013.01)

(56) References Cited

U.S. PATENT DOCUMENTS

| | | | | |
|---|---|---|---|---|
| 4,769,569 | A | * | 9/1988 | Stahlhuth ............... H02N 2/043 |
| | | | | 310/328 |
| 4,952,835 | A | * | 8/1990 | Stahlhuth ............... H02N 2/043 |
| | | | | 310/328 |
| 6,191,522 | B1 | | 2/2001 | Reuter |
| 6,294,859 | B1 | * | 9/2001 | Jaenker .................. H02N 2/043 |
| | | | | 310/328 |
| 2010/0156970 | A1 | | 6/2010 | Ikushima |
| 2010/0308689 | A1 | * | 12/2010 | Rahman .................. E21B 23/00 |
| | | | | 310/328 |
| 2014/0077660 | A1 | * | 3/2014 | Knight .................. H02N 2/043 |
| | | | | 310/328 |
| 2014/0203707 | A1 | | 7/2014 | King et al. |

FOREIGN PATENT DOCUMENTS

| | | |
|---|---|---|
| WO | 2008/146464 A1 | 12/2008 |
| WO | 2012/162604 A1 | 11/2012 |
| WO | 2013/016528 A1 | 1/2013 |

\* cited by examiner

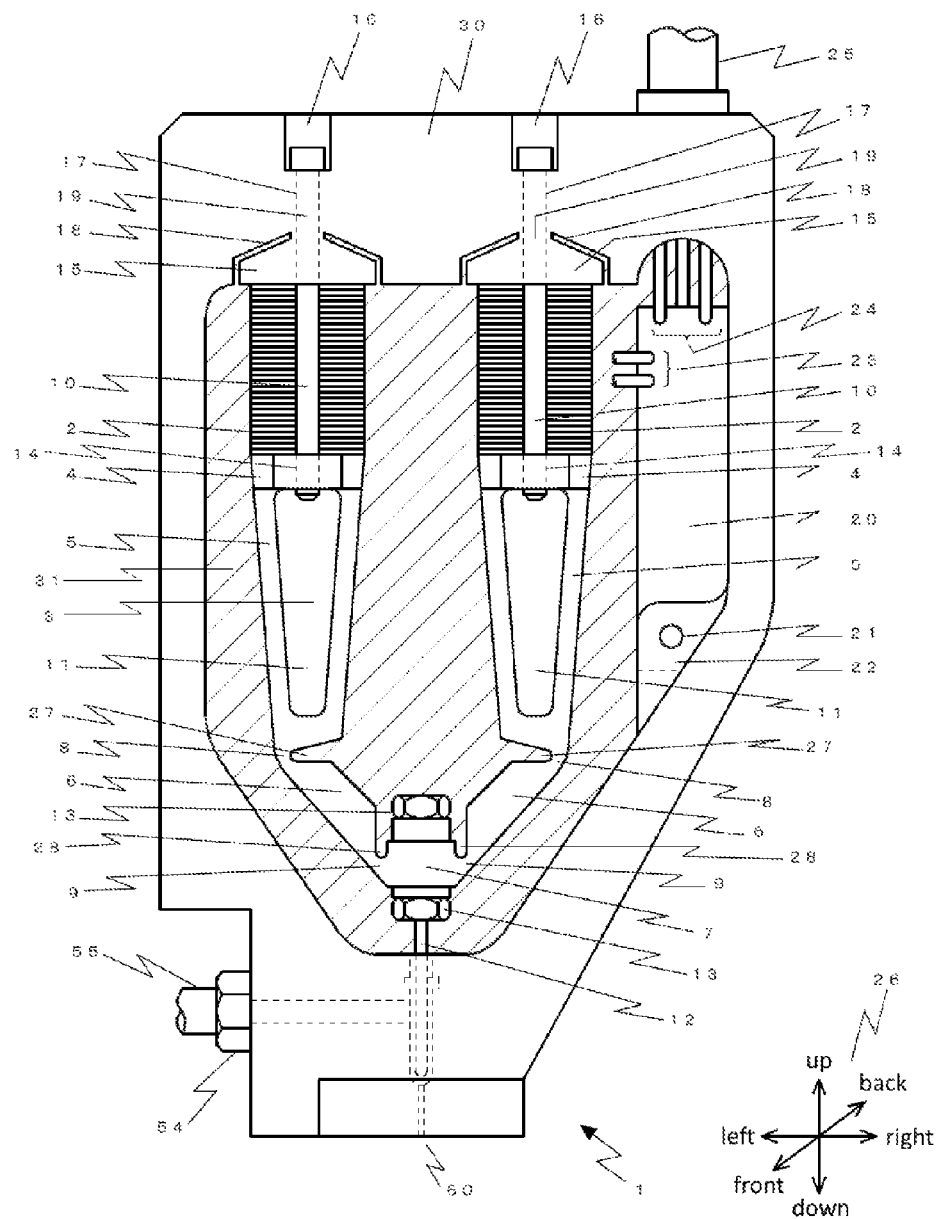
[Fig. 1]

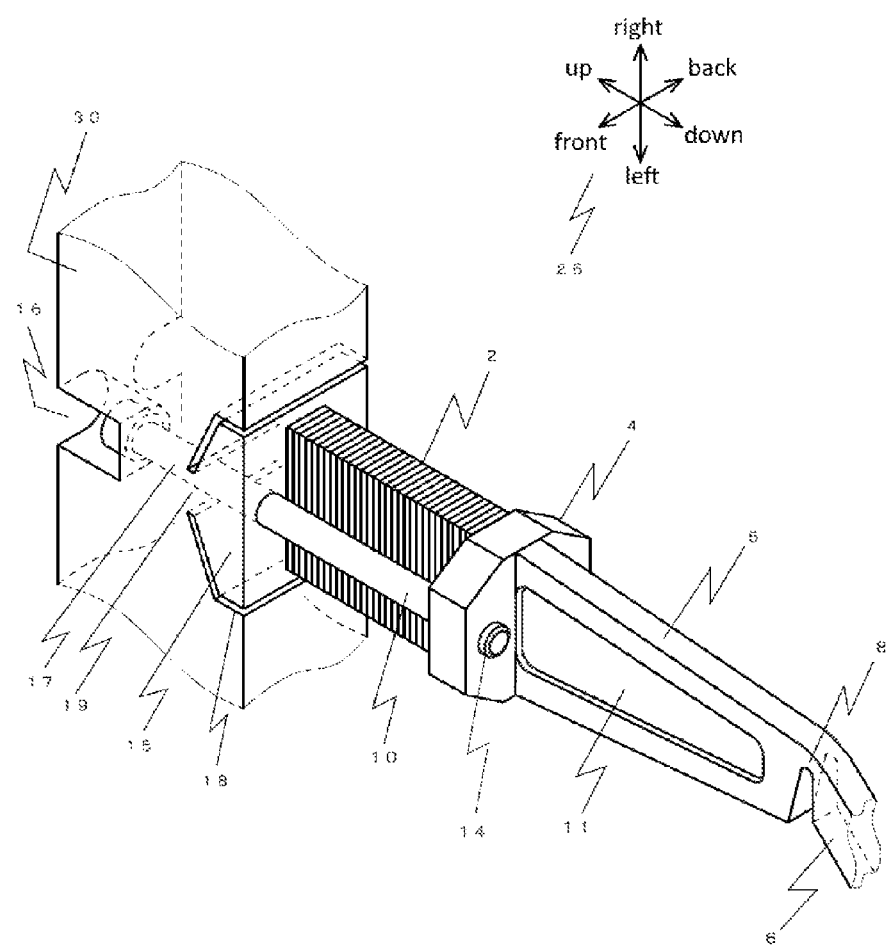
[Fig. 2]

[Fig. 3]
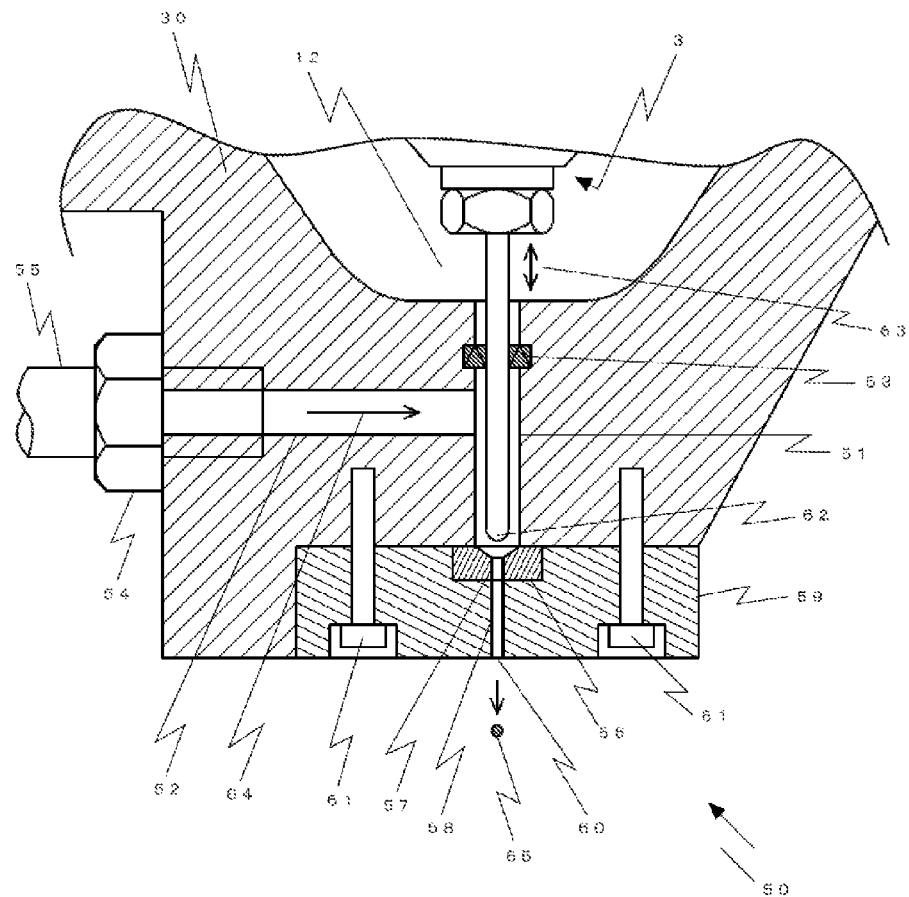

[Fig. 4]
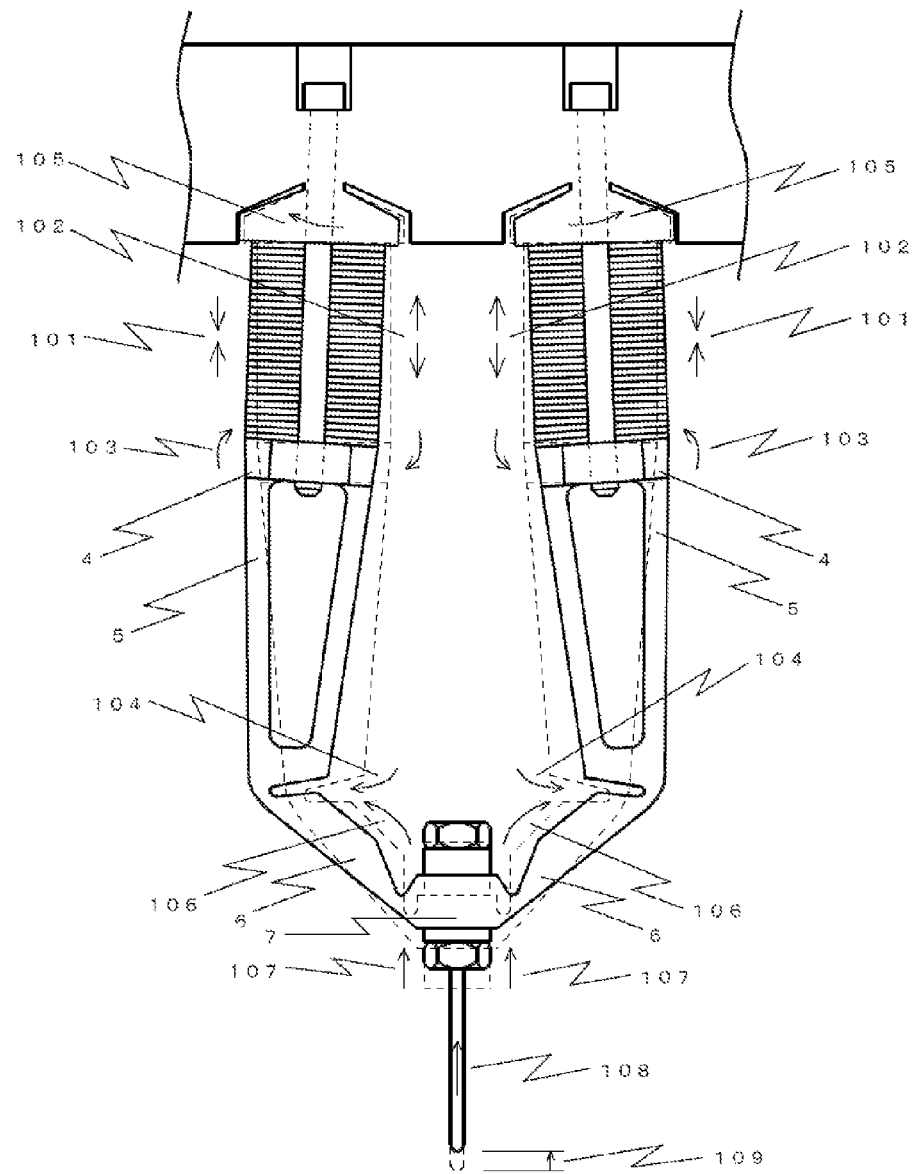

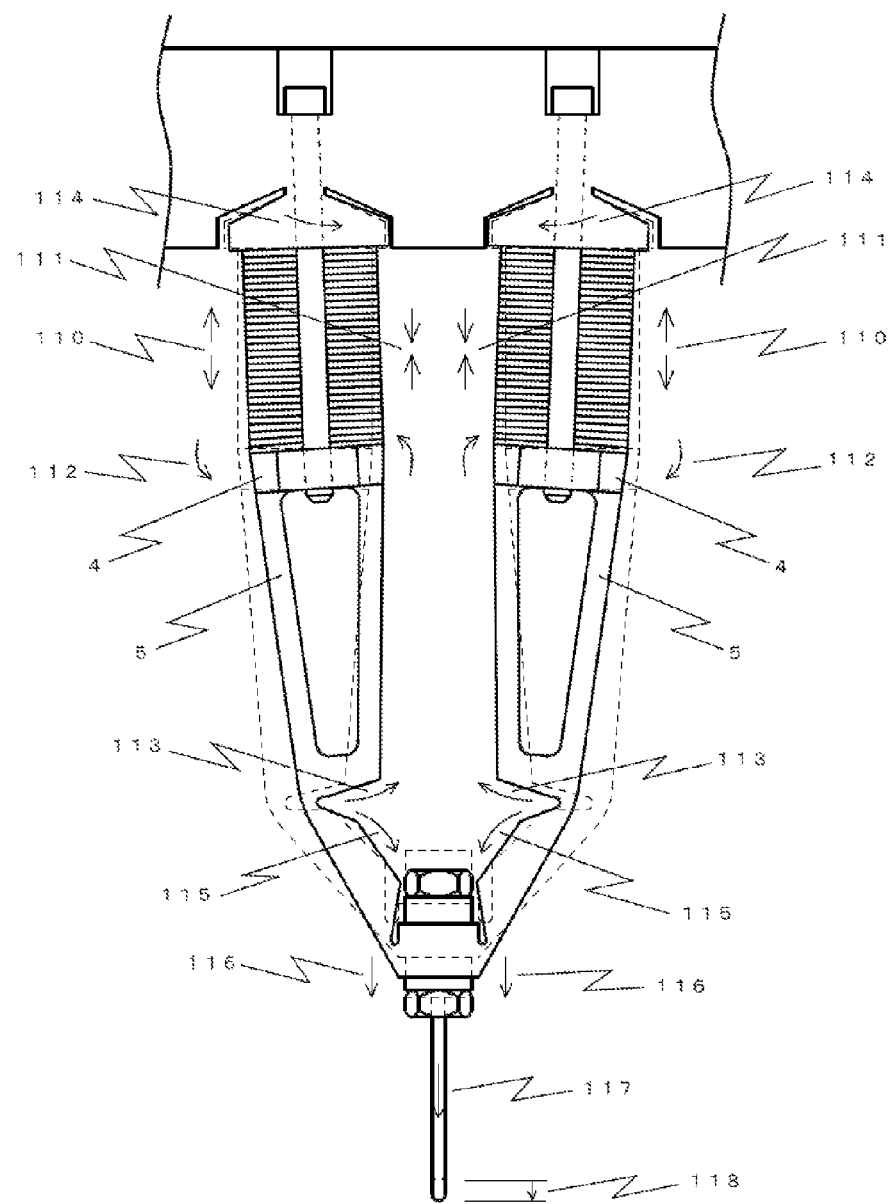
[Fig. 5]

[Fig. 6]
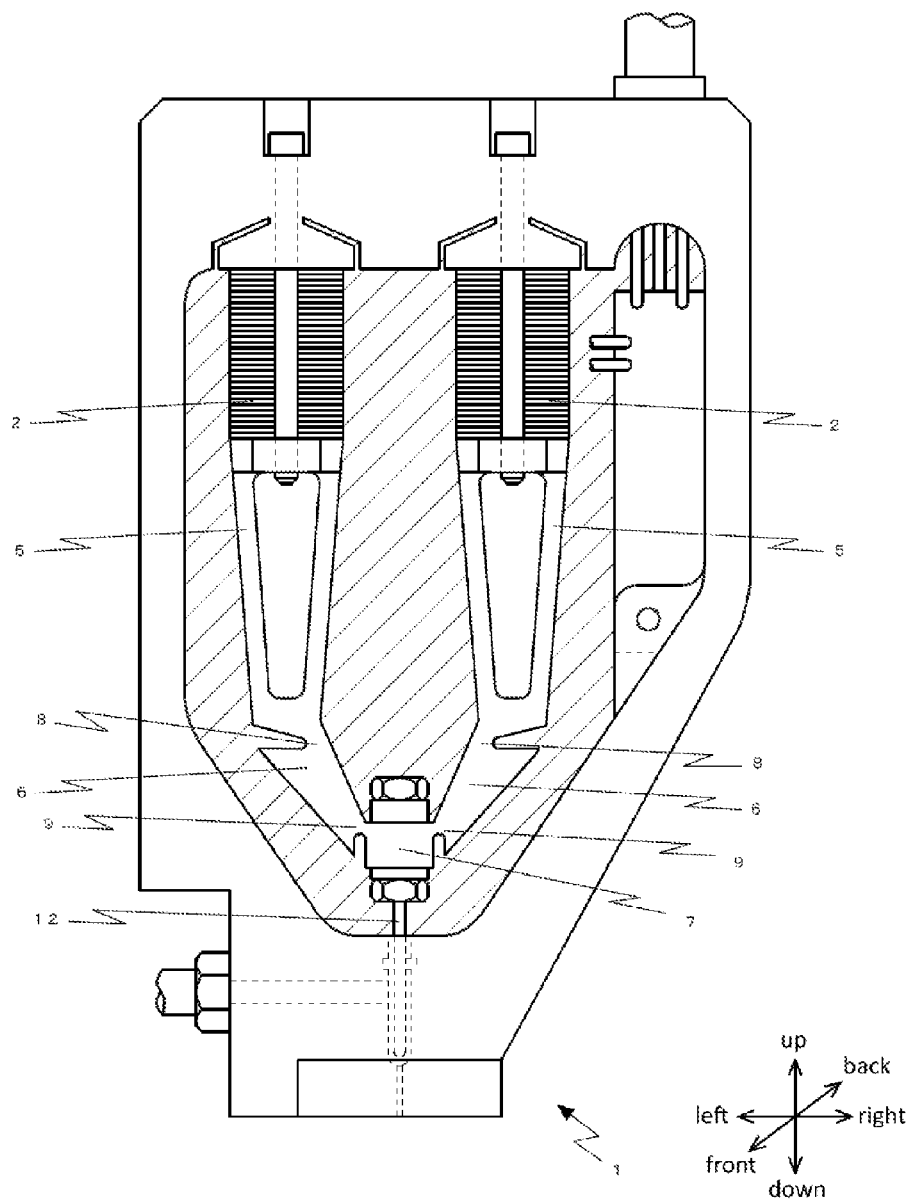

[Fig. 7]
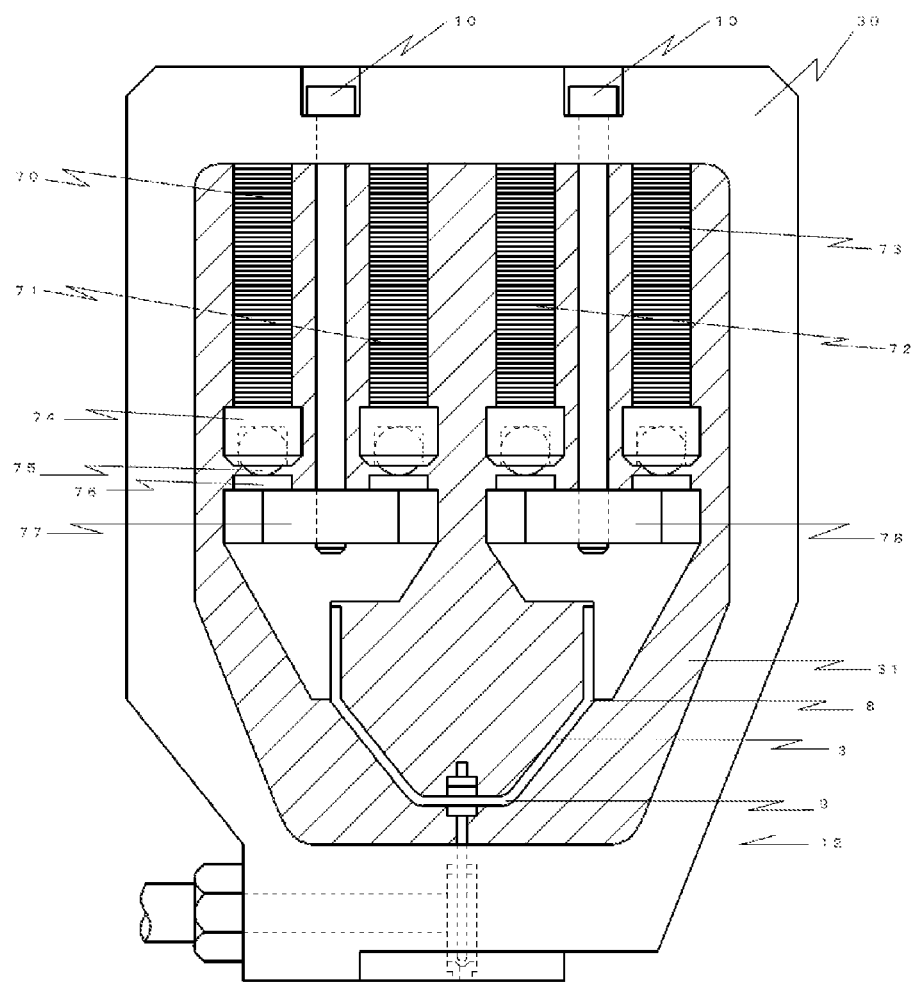

[Fig. 8]
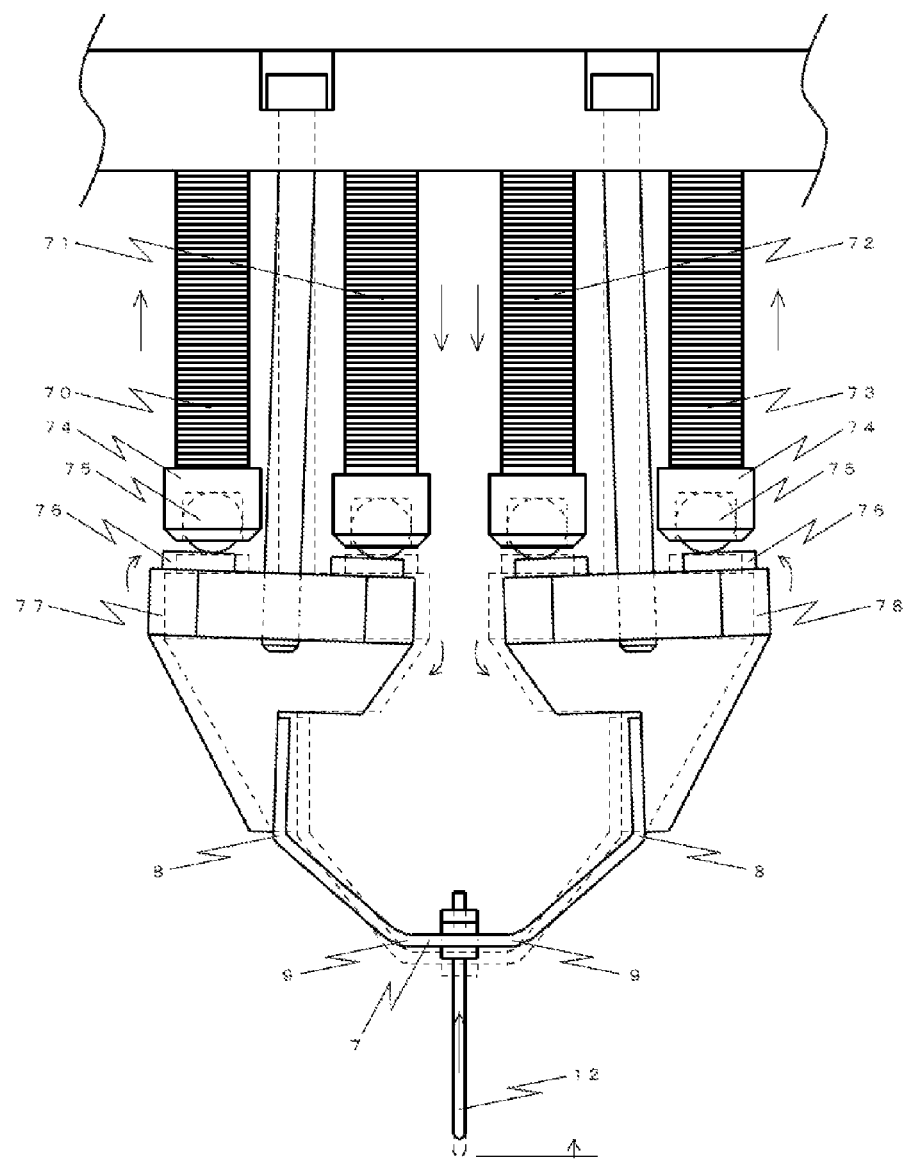

[Fig. 9]
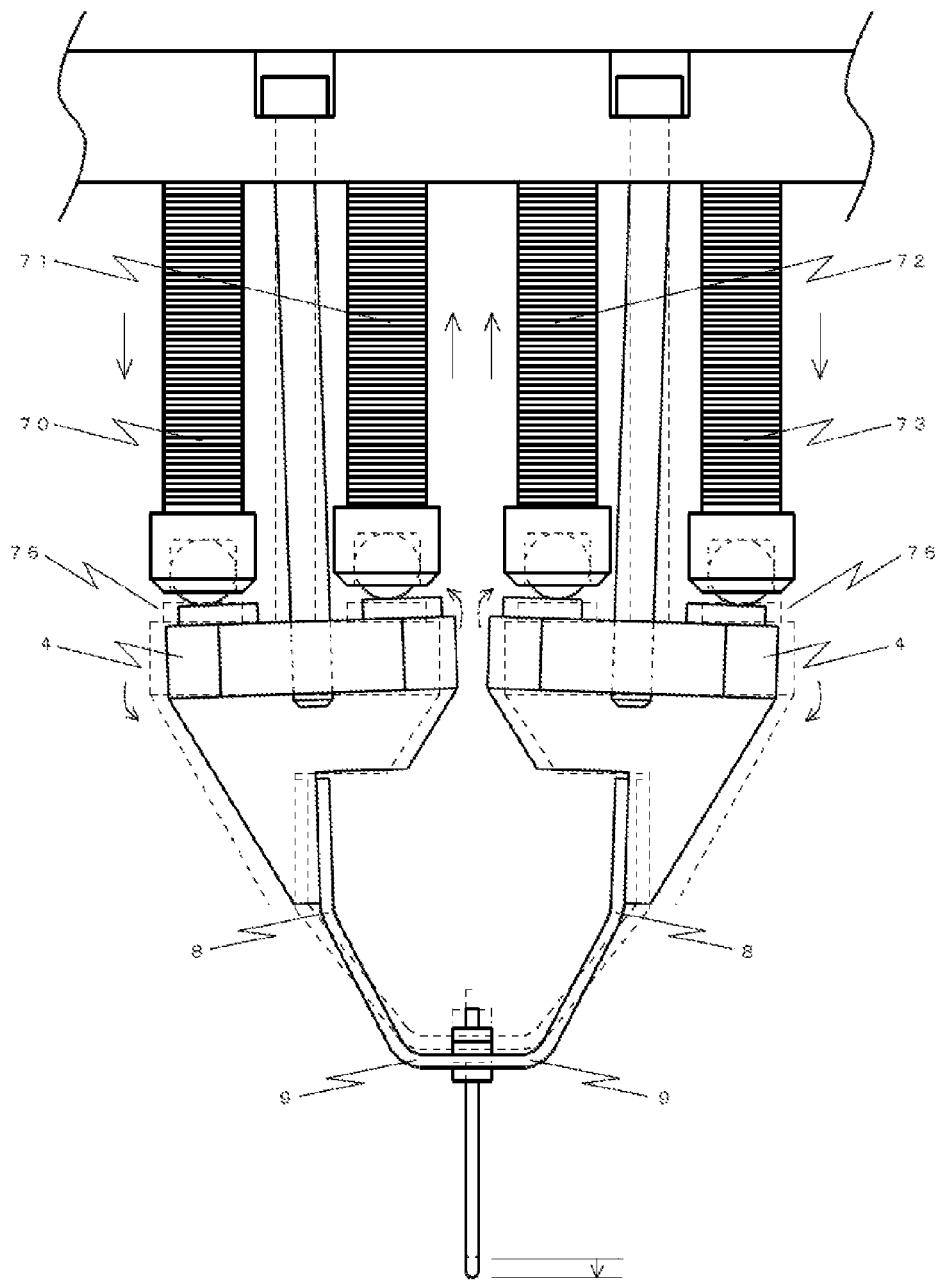

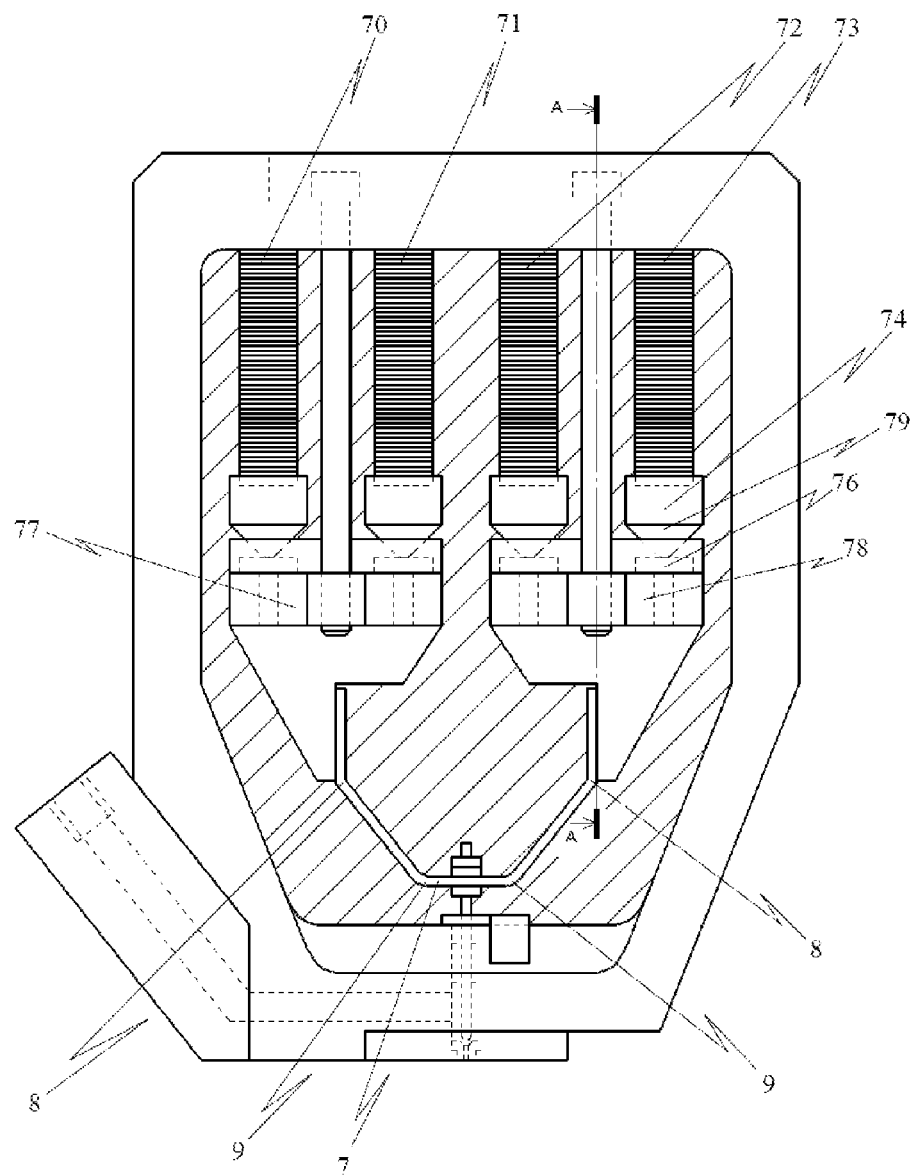
[Fig. 10]

[Fig. 11]
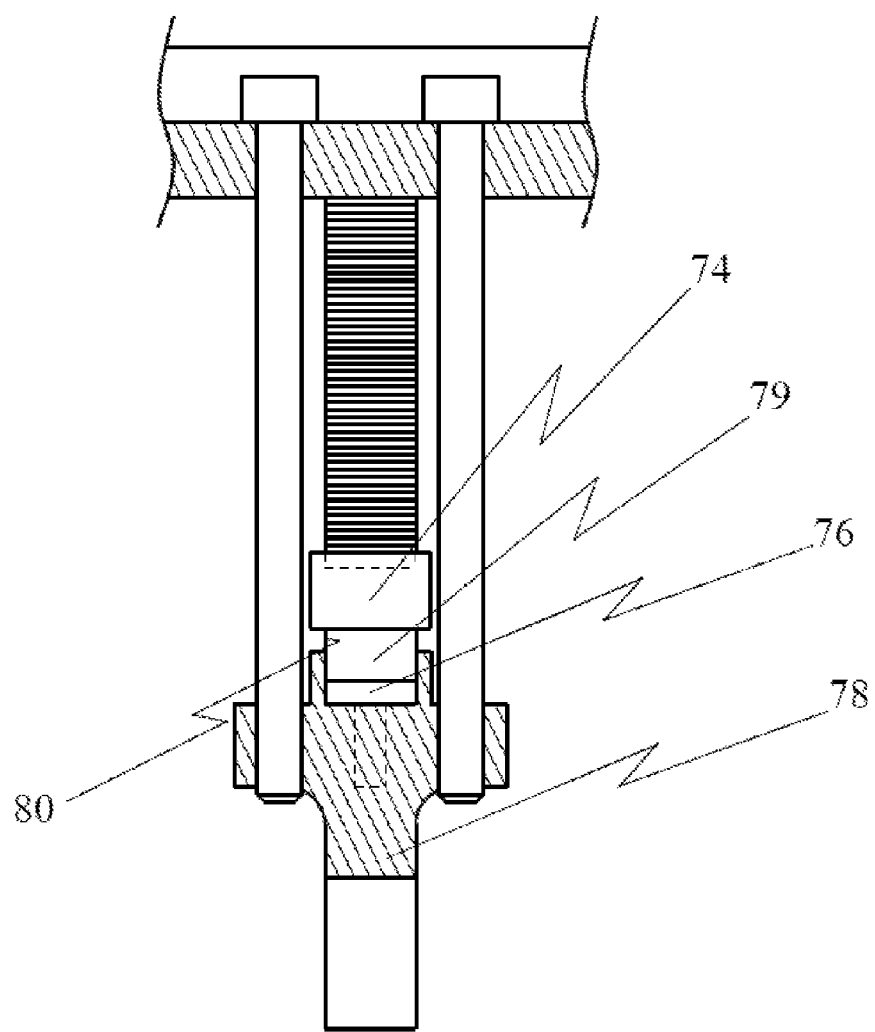

LIQUID DROPLET DISCHARGE DEVICE

TECHNICAL FIELD

The present invention relates to a liquid droplet discharge device for discharging liquid materials, ranging from materials having low viscosities, such as water, solvents and reagents, to materials having comparatively high viscosities, such as solder pastes, silver pastes, and adhesives, in a minute amount with high accuracy regardless of whether the liquid materials contain fillers or not. A term "needle" used in this Description involves a rod-shaped member or a plunger, which has a tip being flat or spherical, or provided with a projection.

BACKGROUND ART

There is known a device in which a liquid material is discharged in a flying mode with reciprocal movement of a plunger. For example, Patent Document 1 discloses a jet type discharge device.

Recently, discharge operations at higher speeds have been wanted from the viewpoint of improving productivity, and a demand for increasing the number of discharges within a certain time in the jet type discharge device has spread. Thus, a liquid droplet discharge device is required to repeatedly operate a plunger at a high speed.

In many cases, an actuator using, e.g., a motor, air, or a piezoelectric element, is used as a driving source for moving the plunger. The piezoelectric element operates at a high speed, but its displacement amount is small. Therefore, the piezoelectric element is generally utilized as an actuator in which the displacement amount is increased through a magnifying mechanism. Known actuators utilizing the piezoelectric elements are disclosed in, e.g., Patent Documents 2 and 3.

CITATION LIST

Patent Documents

Patent Document 1: Re-Publication in Japan of PCT International Patent Application No. 2008/146464
Patent Document 2: Japanese Patent Laid-Open Publication No. H4-365384
Patent Document 3: Japanese National Publication of PCT International Patent Application No. 2001-503920

SUMMARY OF INVENTION

Technical Problem

The known piezoelectric actuators have such a characteristic that, as a magnification rate of the displacement magnifying mechanism relative to a displacement of the piezoelectric element increases, power reduces and a greater difficulty occurs in overcoming resistance. In other words, in a discharge device including the displacement magnifying mechanism together with the piezoelectric element, there has been a limit in increasing the magnification rate of the displacement magnifying mechanism when a liquid material having a comparatively high viscosity is discharged.

It is also conceivable to increase the displacement of the piezoelectric element itself for the purpose of increasing the magnification rate of the displacement magnifying mechanism. However, that solution raises a problem of increasing sizes of the piezoelectric actuator and the discharge device. Because the discharge device is used in a state mounted to an XYZ relatively moving apparatus, such an increase in size is disadvantageous from the view point of moving the plunger at a higher speed.

Furthermore, the displacement magnifying mechanism of related art is constituted by a combination of plural parts, and play or backlash generates in a coupling portion between parts, e.g., a hinge. Accordingly, a small displacement of the piezoelectric actuator cannot be transmitted to a needle with high efficiency. As a result, the needle cannot be operated to reciprocate at a high speed by the piezoelectric actuator having a small size.

On the other hand, when a spring is used in a drive device, it is difficult to control an operation of the spring in a process causing the spring to extend from a contracted state.

An object of the present invention is to provide a liquid droplet discharge device including a reciprocating needle in which a liquid material can be discharged in a flying mode at a high tact by moving a needle at a high speed with a small-sized drive device.

Solution to Problem

The inventor has succeeded in utilizing a drive device, which has a small displacement, in a liquid droplet discharge device by transmitting driving force to a needle from the drive device through a U-shaped member. In more detail, the present invention is constituted by the following technical means.

The present invention provides a liquid droplet discharge device (1) including a liquid chamber (51) that is communicated with a discharge opening (60), and that is supplied with a liquid material, a needle (12) having a tip that is advanced and retracted within the liquid chamber, a drive device (2) that operates the needle to advance and retract, and a displacement magnifying mechanism (3), the liquid droplet discharge device discharging liquid droplets in a flying mode from the discharge opening, wherein the drive device (2) is constituted by an even number of drive devices disposed in a left-right symmetric relation, the displacement magnifying mechanism includes an elastically deformable U-shaped member (5, 6, 7, 8 and 9) having a bottom portion to which the needle is coupled, and the drive devices (2) operate the needle (12) to retract by applying forces acting to move the two ends of the U-shaped member away from each other, and to advance by applying forces acting to move the two ends of the U-shaped member closer to each other.

In the above liquid droplet discharge device, the drive devices (2) may move the two ends of the U-shaped member away from each other by pressing inner sides of the two ends of the U-shaped member downwards or pulling outer sides of the two ends thereof upwards, and may move the two ends of the U-shaped member closer to each other by pressing the outer sides of the two ends of the U-shaped member downwards or pulling the inner sides of the two ends thereof upwards. In this connection, the U-shaped member may include arms having first and second displacement axes (8 and 9) that are disposed symmetric with respect to a center line in a vertical direction. Preferably, the arms may be integrally-formed arms. Furthermore, the U-shaped member may include two first arms (5) connected to the drive devices, two second arms (6) joined to the two first arms through first notched portions (27), respectively, and a bottom member (7) joined to the two second arms through second notched portions (28), respectively, wherein the first notched portions constitute the first displacement axes (8), and the second notched portions constitute the second displacement axes (9).

In the above liquid droplet discharge device (1), the drive devices may be each a piezoelectric actuator. Moreover, each of the drive devices may be connected to the U-shaped member through a coupling member that allows a lower end of the drive device to slide in a left-right direction, and that restricts movement of the drive device in a front-back direction.

The liquid droplet discharge device (1) may be constituted as follows. The drive devices are constituted by a first drive device (70) arranged on a leftmost side, a second drive device (71) arranged adjacent to the first drive device, a third drive device (72) arranged adjacent to the second drive device, and a fourth drive device (73) arranged on a rightmost side. The first and second drive devices are coupled to one end of the U-shaped member through a first coupling member (77), and the third and fourth drive devices are coupled to the other end of the U-shaped member through a second coupling member (78). The second drive device and the third drive device are operated when the needle (12) is moved to retract, and the first drive device and the fourth drive device are operated when the needle is moved to advance.

The present invention further provides an application apparatus including the above liquid droplet discharge device (1), a work table on which an application object is placed, a relatively moving device that moves the liquid droplet discharge device (1) and the application object relatively to each other, and a liquid material supply source that supplies a liquid material to the liquid droplet discharge device (1).

Advantageous Effect of Invention

According to the present invention, the liquid droplets can be discharged at a high tact by moving the needle at a high speed with the small-sized drive device.

Furthermore, a viscous liquid material can be discharged in a flying mode even by the compact drive device.

Moreover, with the constitution including the piezoelectric actuators, since operations of piezoelectric elements can be controlled in accordance with electrical pulse signals, good reproducibility of strokes are ensured and the operations of the piezoelectric elements can be controlled easily.

BRIEF DESCRIPTION OF THE DRAWINGS

FIG. 1 is a front view of a liquid droplet discharge device of Example 1.

FIG. 2 is a partial enlarged perspective view of an actuator section equipped in the liquid droplet discharge device of Example 1.

FIG. 3 is an enlarged sectional view of principal components, the view being referenced to explain a discharge section of the liquid droplet discharge device of Example 1.

FIG. 4 is a front view referenced to explain an operation of ascending a needle in Example 1.

FIG. 5 is a front view referenced to explain an operation of descending the needle in Example 1.

FIG. 6 is a front view of a liquid droplet discharge device of Example 2.

FIG. 7 is a front view of a liquid droplet discharge device of Example 3.

FIG. 8 is a front view referenced to explain an operation of ascending the needle in Example 3.

FIG. 9 is a front view referenced to explain an operation of descending the needle in Example 3.

FIG. 10 is a front view of a liquid droplet discharge device of Example 4.

FIG. 11 is a sectional view taken along AA in FIG. 10.

LIST OF REFERENCE SIGNS

Reference signs used in the drawings are listed below.

1 discharge device/2 actuator/3 displacement magnifying mechanism/4 support block/5 first arm/6 second arm/7 bottom member/8 first displacement axis/9 second displacement axis/10 fixation screw/11 recess/12 needle/13 needle fixing member/14 through-hole/15 swing block/16 countersunk portion/17 through-hole/18 groove/19 joining portion/20 control board/21 board fixing member/22 board fixing portion/23 wiring line a/24 wiring line b/25 cable/26 coordinate system/27 first notched portion/28 second notched portion/30 housing/31 cavity/50 discharge section/51 operating space/52 supply flow path/53 sealing member/54 joint/55 tube/56 valve seat member/57 communication hole/58 discharge hole/59 nozzle plate/60 discharge opening/61 nozzle plate fixing member/62 needle tip/63 needle operating direction/64 liquid flow/65 liquid material in form of a liquid droplet/70 actuator A/71 actuator B/72 actuator C/73 actuator D/74 holder/75 ball/76 abutment plate/77 first support block/78 second support block/79 abutment member/80 dent/101 motion a of actuator/102 motion b of actuator/103 motion a of support block/104 motion a of first arm/105 motion a of swing block/106 motion a of second arm/107 motion a of bottom member/108 motion a of needle/109 moving amount a of needle/110 motion c of actuator/111 motion d of actuator/112 motion b of support block/113 motion b of first arm/114 motion b of swing block/115 motion b of second arm/116 motion b of bottom member/117 motion b of needle/118 moving amount b of needle Description of Embodiments The present invention relates to a liquid droplet discharge device in which a needle is reciprocated by a drive device (actuator) at a high speed in an up-down direction and a liquid material is discharged in a state of liquid droplets from a discharge opening. In the liquid droplet discharge device of the present invention, the needle is moved in the up-down direction through a process that tips of an even number of drive devices (actuators) are displaced in directions inclined from a vertical direction instead of being displaced in the vertical direction, and that the displacements of the tips are converted to displacements in the vertical direction by a displacement magnifying mechanism. The even number of drive devices are arranged in a line symmetric relation with respect to an axis of the needle, and they are operated in such a manner that lower ends of the drive devices move away from each other and closer to each other with application of operating voltages. In the present invention, needle driving power necessary to discharge a liquid having a comparatively high viscosity (e.g., a liquid having a viscosity of several hundred to several thousand cps) can be ensured by employing the plurality of drive devices.

The drive devices (actuators) are coupled to an elastically deformable U-shaped member, which has an opening formed at an upper end and which is coupled at its lower end to the needle, directly or through a coupling member (e.g., a support block 4 described later). The displacement magnifying mechanism including the U-shaped member converts driving forces of the drive devices in a left-right direction to driving force in the up-down direction. The U-shaped member of the displacement magnifying mechanism is constituted by an integrally-formed elastic member. If there is backlash or play in the displacement magnifying mechanism, the needle could not move along a steady specific orbit each time it is operated, and accuracy in an amount of the discharged liquid would degrade. However, such a problem can be avoided by employing the integrally-formed U-shaped member. Here, the term "U-shaped" involves shapes analogous to a U-shape. Thus, the U-shaped member involves any types of U-shaped arms each having first and second displacement axes, which are symmetrically disposed with respect to a vertical line, regardless of whether the U-shaped arms have recesses, projections, and/or notches.

Furthermore, since the displacement magnifying mechanism has a small number of parts, the liquid droplet discharge device can be obtained in reduced weight and in a compact size. The liquid droplet discharge device is mounted to an XYZ relatively moving apparatus and is moved in XYZ directions relative to a work in use. Therefore, weight reduction of the liquid droplet discharge device is important. In particular, realization of a compact size is essential in a desk top device. The XYZ relatively moving apparatus is constituted by employing, e.g., a combination of an electric motor and a ball screw, a mechanism using a linear motor, or a mechanism transmitting motive power through a belt and a chain, for example.

When the drive device is constituted by a small-sized piezoelectric actuator formed by laminating piezoelectric elements, a displacement amount of the drive device is small, and a displacement magnifying mechanism for magnifying the displacement amount is required. The smaller the number of parts of the displacement magnifying mechanism, the higher is a transmission speed of the driving force of the piezoelectric actuator, and the higher is transmission efficiency. The reason is that the presence of not a few parts causes influences, such as a phase delay, due to play or backlash in a movable portion of a hinge, etc. Accordingly, the U-shaped member including the integrally-formed arm is used in a preferred embodiment of the present invention. The U-shaped member is fabricated, for example, by pressing a metal plate. With the use of that U-shaped member, even a slight displacement of the piezoelectric element can be efficiently utilized to generate a displacement of the needle, and the piezoelectric element can be operated at a high tact. For example, a stroke of the needle is 100 μm or less, and the liquid can be discharged under conditions of 0.1 μg to 10 μg per droplet and 50000 shots or less per second.

Because the operation of the piezoelectric element is controlled in accordance with an electrical pulse signal, the piezoelectric actuator is easy to control. In other words, the piezoelectric actuator in which the piezoelectric element is operated to displace in accordance with an applied pulse waveform is superior to a spring type actuator in points of easier automation and higher reproducibility of stroke.

Details of the present invention will be described below in connection with Examples, but the present invention is in no way limited by the following Examples.

EXAMPLE 1

Example 1 relates to a liquid droplet discharge device that is mounted to an application apparatus including an XYZ relatively moving apparatus, and that is used to carry out application and drawing of a desired pattern by discharging a liquid material from a discharge opening in a state of liquid droplets while the discharge opening and a work table on which a work is placed are relatively moved. The constitution and operation of the liquid droplet discharge device of Example 1 are described below.

<Constitution>

FIG. 1 is a plan view of the liquid droplet discharge device of Example 1, and FIG. 2 is a partial enlarged perspective view of an actuator unit (on the right side) equipped in the liquid droplet discharge device of Example 1. A hatched area in FIG. 1 represents a space. In FIG. 2, some of components, such as a fixation screw hidden on the backside, are omitted for easier understanding of the drawing.

In the following description, as represented by a coordinate system denoted by 26 in each drawing, the nozzle side is called the "lower (down) side", the actuator side is called the "upper (up) side", the control board side is called the "right side", and the coupling side is called the "left side". A direction toward the front of a drawing sheet of each figure is called a "front direction", and the backside of the drawing sheet is called the "backside" in some cases.

A liquid droplet discharge device 1 of Example 1 includes, as main components, two actuators 2, a displacement magnifying mechanism 3, a housing 30, and a discharge section 50. Those components will be described in detail below.

(1) Actuator (Drive Device)

The actuators 2 and 2 in this Example are each a piezoelectric actuator that is constituted by laminating a large number of thin-plate piezoelectric elements (e.g., piezoelectric ceramic thin layers) into a rectangular parallelepiped shape, and that has a surface perpendicular to a lamination direction, the surface being able to incline obliquely upon application of a voltage. Each of the actuators 2 and 2 in this Example has a size of, e.g., 10 mm (W)×10 mm (D)×40 mm (H). In each of the actuators 2 and 2, upon application of a voltage, when the right side with respect to a center axis in the lamination direction (up-down direction) extends, the left side contracts and, conversely, when the left side extends, the right side contracts. Hence the actuator operates such that the surface perpendicular to the lamination direction inclines obliquely to the left and the right. The displacement magnifying mechanism 3 having a U-shape and connected to the actuators 2 and 2 can be caused to displace by the action described above. That type of actuator is disclosed in, e.g., Patent Document 3 (Japanese National Publication of PCT International Patent Application No. 2001-503920).

In this Example, as illustrated in FIG. 1, ones (upper surfaces) of respective two surfaces of the actuator 2 and 2 in the lamination directions are joined to swing blocks 15 and 15 that are formed in the housing 30, and the other surfaces (lower surfaced) thereof are joined to support blocks 4 and 4 that are connected to first arms 5 and 5. Here, as illustrated in FIG. 2, the upper surfaces of the actuators 2 and 2 are each preferably joined to substantially centers of the housing 30 and the swing block 15 in a thickness direction thereof, i.e., in the front-back direction. Furthermore, preferably, a thickness of each of the support blocks 4 and 4 in the front-back direction is substantially the same as that of the housing 30, and the lower surfaces of the actuators 2 and 2 are joined to substantially centers of the support blocks 4 and 4 in a width direction thereof, i.e., in the front-back direction.

In this Example, as illustrated in FIG. 2, a thickness of each of the actuators 2 and 2 in the front-back direction is about ⅓ of that of the housing 30 and the swing block 15 in the front-back direction.

One swing block 15 and one support block 4 are joined to each other by two fixation screws 10 and 10. It is to be noted that, although FIG. 2 illustrates only one fixation screw 10 on the front side, the other similar fixation screw 10 is further disposed on the back side with the actuator 2 interposed between the two fixation screws. Each fixation screw 10 has a length enough to penetrate through an upper portion of the housing 30 including the swing block 15, and to reach a through-hole 14 of the support block 4 along the lamination direction (up-down direction) of the actuator 2. Four through-holes 17 allowing the fixation screws to be inserted therethrough are bored in the upper portion of the housing 30, and the two through-holes 17 penetrate each swing block 15. Screw grooves are not formed in inner surfaces of the four through-holes 17. On the other hand, screw grooves are formed in the four through-holes 14 that are formed in the support blocks 4, and that allow distal ends of the fixation screws 10 to be inserted therethrough. With that constitution, the actuators 2 and 2 can be each fixed in a state sandwiched between the swing block 15 and the support block 4 by fastening the fixation screws 10.

As illustrated in FIG. 1, the two actuators 2 and 2 are disposed at line-symmetric positions with respect to an axis of a needle 12. The actuators 2 and 2 are mounted such that, when the actuators are operated to incline their surfaces perpendicular to the lamination direction of the thin-plate piezoelectric elements in predetermined directions, the directions of the inclining operations are exactly symmetric. In other words, upon application of voltages to the actuators 2 and 2, the actuators 2 and 2 are inclined in the symmetrically identical postures and directions (e.g., toward the outer side or the inner side at the same time). The left-right symmetric inclining operations of the actuators 2 and 2 are transmitted to the needle 12 through the displacement magnifying mechanisms 3, and the liquid material is given with inertial force with a reciprocal motion of the needle 12. As a result, liquid droplets can be discharged.

(2) Displacement Magnifying Mechanism

As illustrated in FIG. 1, the displacement magnifying mechanism 3 is constituted by an elastically-deformable U-shaped member (5, 6, 7, 8 and 9) bridging a pair of support blocks 4 and 4. More specifically, the displacement magnifying mechanism 3 is constituted by first arms 5 and 5, second arms 6 and 6 joined respectively to the first arms 5 and 5 at first joining portions 8 and 8 each having a constricted shape, and a bottom member 7 coupled to the second arms 6 and 6 at second joining portions 9 and 9 each having a constricted shape. Looking at the displacement magnifying mechanism 3 from the front, the first arms 5 and 5 are widest, and the second arms 6 and 6 are narrower than the first arms 5 and 5. The needle 12 having a cylindrical shape and constituting the discharge section 50 is joined to a distal end (lower end) of the bottom member 7.

Respective one ends of the first arms 5 and 5 are each joined to the support block 4 having an octagonal shape when viewed from above. The shape of the support block 4 is not limited to the illustrated octagonal shape, and it may be optionally set to one of other suitable shapes including polygonal shapes, a circular shape, and an elliptic shape. As an alternative, the support blocks 4 and 4 may be formed integrally with the first arms 5 and 5, respectively.

A thickness of each of the first arms 5 and 5 in the front-back direction is substantially the same as that of each of the actuators 2 and 2. The first arms 5 and 5 are each formed to have a width in the left-right direction gradually narrowing toward the lower side from the upper side (i.e., a tapered shape) when viewed from the front, and recesses 11 and 11 are formed in central portions of the first arms 5 and 5, respectively. The recesses 11 are formed in the same shape at the same positions on the front and back sides of each of the first arms 5 and 5, i.e., four in total. The four recesses 11 contribute to reducing weight while keeping rigidity such that the first arms 5 will not deform in themselves. Lower ends of the first arms 5 and 5 are coupled to the second arms 6 and 6 at the first joining portions 8 and 8, respectively. The first joining portions 8 and 8 are formed in a width narrower than widths of the arms (5 and 6) such that first notched portions 27 and 27 are formed at the lower ends of the first arms 5 and 5 on the inner side, respectively.

The second arms 6 and 6 each have a trapezoidal shape when viewed from the front, and are joined at two corners of a lower base (long side) thereof to the first arms 5 and 5 and the bottom member 7. More specifically, the second arms 6 and 6 are joined at the corners thereof on the upper side to the first arms 5 and 5 through the first joining portions 8 and 8, respectively, and at the corners thereof on the lower side to the bottom member 7 through second joining portions 9 and 9, respectively. Furthermore, the second arms 6 and 6 are each disposed in such a posture that an upper opposite side interconnecting an upper base and the lower base of the trapezoidal shape is positioned substantially horizontal, and that a lower opposite side interconnecting the upper base and the lower base of the trapezoidal shape is positioned substantially vertical. The second joining portions 9 and 9 are formed in a width narrower than the widths of the arms (5 and 6) such that second notched portions 28 and 28 are formed at lower ends of the second arms 6 and 6 on the inner side, respectively.

The bottom member 7 is a substantially rectangular member and is joined at two sides thereof in the left-right direction to the second arms 6 and 6 through the second joining portions 9 and 9, respectively. The needle 12 is joined to a center of a lower end of the bottom member 7 through a needle fixing member 13.

The needle 12 is operated to reciprocate up and down with motions of the actuators 2 and 2 transmitted to the needle 12 through the displacement magnifying mechanism 3. Stated in another way, the first joining portions 8 and 8 and the second joining portions 9 and 9, each having a wedge-shaped notch extending outwards from the inner side, act as motion axes (hinges) and serve to transmit the motions of the actuators 2 and 2 to the needle 12. In this Example, it is important that the U-shaped member constituting the displacement magnifying mechanism 3 is not constituted by coupling a plurality of separately fabricated members. In other words, it is important that the arms (5 and 6) constituting the displacement magnifying mechanism 3 are integrally formed, and that the motions of the actuators 2 and 2 are transmitted through the joining portions (motion axes or hinges) between the arms by causing integrally-formed members to bend and stretch. The reason is that, if the joining portions (8 and 9) between the arms are constituted by separate members to be coupled, backlash or play occurs in each of coupled portions, thus generating problems of a loss of power transmission and reduction in accuracy of steady operation of the needle.

The displacement magnifying mechanism 3 described above is preferably made of a metal material having large elasticity, e.g., steel or a copper alloy. By employing such a metal material, a mechanism for transmitting the displacements of the actuators 2 and 2 to the needle 12 can be easily implemented without separately disposing a member generating backlash or play, e.g., a spring or a link.

(3) Housing

As illustrated in FIG. 1, the housing 30 is a member that has a trapezoidal shape when viewed from the front, and that is formed to surround the actuators 2 and 2 and the displacement magnifying mechanism 3. The housing 30 has a cavity 31 having a shape in match with outer shapes of the actuators 2 and 2 and the displacement magnifying mechanism 3 to be able to accommodate them. The cavity 31 denoted by hatching in FIG. 1 is formed to penetrate through the housing 30 from a front surface to a back surface thereof.

As illustrated in FIG. 2 as well, the swing blocks 15 and 15 for connection to the actuators 2 and 2 are disposed in an upper portion of the housing above the cavity 31 (i.e., in a cavity ceiling). The swing blocks 15 and 15 in this Example are each a member having a bell-like shape, and their tops are joined to the upper portion of the housing 30 through joining portions 19 and 19. In this Example, the swing block 15 and the joining portion 19 are formed by cutting grooves 18 that penetrate through the housing 30 from the front surface to the back surface thereof. Each joining portion 19 is formed in a width that is necessary to form the through-hole 17, and that ensures a swinging ability of the swing block 15 under cooperation with the grooves 18 and 18.

In an upper outer peripheral surface of the housing 30, four countersunk portions 16 are formed as holes such that heads of the fixation screws 10 will not protrude toward the outer side beyond the outer periphery of the housing 30. The four through-holes 17 allowing the four fixation screws 10 to be slidably inserted therethrough are formed to extend from the four countersunk portions 16 to the cavity 31 via the swing blocks 15. The fixation screws 10 are able to smoothly ascend and descend within the through-holes 17 without impeding the motion of the displacement magnifying mechanism 3, and hence they are adaptable for minute motions of the actuators 2 and 2.

In a lower portion of the housing 30, the discharge section 50 is disposed which receives the liquid material supplied thereto, and which discharges the liquid material from a discharge hole 58, formed in a lower surface of the housing 30, by the action of the needle 12. Details of the discharge section 50 will be described later with reference to FIG. 3.

A control board 20 is fixed to a board fixing portion 22, which is disposed in the cavity 31 on the right inner peripheral side, by employing a board fixing member 21. Wiring lines a 23 connected to the actuators 2 and 2, and wiring lines b 24 connected to a controller (not illustrated) for controlling the operations of the actuators 2 and 2 are connected to the control board 20. The wiring lines b 24 are bundled together into one cable 25 at an upper outer surface of the housing 30, and the cable 25 is connected to the controller (not illustrated). Unlike this Example, the control board 20 may be disposed integrally with the controller (not illustrated) instead of being disposed within the housing 30. In such a case, only the wiring lines a 23 connected to the actuators 2 and 2 are guided to the inside of the housing 30.

Over the front and back surfaces of the housing 30, covers (not illustrated) are disposed to entirely cover both the surfaces. Those covers serve to avoid foreign matters, which may impede the operation, from coming into the housing 30, and to prevent operator's fingers or clothes, etc. from contacting the inner components.

(4) Discharge Section

FIG. 3 is an enlarged sectional view of principal components in the discharge section of the discharge device of this Example. In FIG. 3, hatched areas represent the components in sections.

The discharge section 50 in this Example is constituted by the needle 12 fixed to the bottom member 7 of the displacement magnifying mechanism 3, and flow paths (51, 52 and 58) formed in the housing 30. Those flow paths are constituted by an operating space 51 through which the needle 12 is inserted, a supply flow path 52 through which the liquid material is supplied to the operating space 51, and a communication hole 57 communicating with a discharge opening 60.

The operating space 51 is a bore that is bored in the lower portion of the housing 30 to extend vertically downwards from a lower end of the cavity 31, and that has a greater diameter than the needle 12. The operating space 51 constitutes a liquid chamber. In the operating space 51 filled with the liquid, the cylindrical needle 12 having a semi-spherical tip is moved to advance and retract at a high speed in a state not contacting an inner peripheral surface of the operating space 51, thereby applying inertial force to the liquid material and causing the liquid material to be discharged in a state of liquid droplets. A lower end of the cylindrical operating space 51 is communicated with the communication hole 57 formed in a valve seat member 56 and further with a discharge hole 58 formed in a nozzle plate 59. A lower end of the discharge hole 58 extending in the vertical direction constitutes the discharge opening 60 that is opened downwards. In this Example, the communication hole 57 and the discharge hole 58 have the same diameter, and they are thinner than the needle 12.

The supply flow path 52 is a bore that is formed by boring the lower portion of the housing 30 in the horizontal direction, and that communicates a liquid material supply source (reservoir) and the operating space 51 with each other. The supply flow path 52 in this Example communicates an outer surface of the lower portion of the housing 30 and a side surface of the operating space 51 with each other. A direction in which the supply flow path 52 is formed is not limited to the illustrated one, and the supply flow path 52 may be constituted, for example, by a flow path inclining downwards from the upper side.

A sealing member 53 to prevent the liquid material from leaking into the cavity 31 is disposed between an upper end of the operating space 51 and a communicating portion between the operating space 51 and the supply flow path 52. The liquid material is supplied from the liquid material supply source (not illustrated) to the discharge section 50 through a tube 55 that is connected to the housing through a coupling 54. Instead of using the coupling 54 and the tube 55, the reservoir may be fixed to the housing 30, and may be directly connected to the discharge section 50 through a connection member having a flow path that communicates the housing 30 and the reservoir with each other.

The nozzle plate 59 is removably fixed to the lower surface of the housing 30 by employing nozzle plate fixing members 61 and 61. It is to be noted that the nozzle having the discharge opening is not limited to the illustrated plate-like form, and it may optionally have one of other suitable shapes.

A recess to which the valve seat member 56 is fitted is formed in an upper surface of the nozzle plate 59. The discharge hole 58 is formed as a through-hole that is bored to extend from a center of the recess through the nozzle plate in the vertical direction. The valve seat member 56 fitted to the recess of the nozzle plate 59 is contacted with the lower surface of the housing 30 to close the operating space 51. The valve seat member 56 includes a dent that constitutes an end portion of the operating space 51, and the communication hole 57 that fluidly communicates the operating space 51 and the discharge hole 58 with each other. With the needle 12 operated to reciprocate, a needle tip 62 is alternately abutted against and moved away from the valve seat member 56, whereby the communication hole 57 is closed and opened. When the communication hole 57 is in an open state, the liquid material is discharged to the outside from the discharge opening 60 after passing through the communication hole 57 and the discharge hole 58.

In the discharge device of this Example, since the nozzle plate 59 is constituted by a member separate from the housing 30 in a detachable manner, it is easy, for example, to change a diameter of the discharge hole 58, and to clean the discharge hole 58.

<Operations>

The liquid droplet discharge device constituted as described above operates as follows. Basic ascent and descent operations are first described, and a discharge operation is then described. The following description is made about the operation in the case looking at the needle 12 from the front.

(1) Ascent Operation

FIG. 4 is a front view referenced to explain the operation of ascending the needle 12. In FIG. 4, dotted lines represent positions before voltages are applied to the actuators.

When voltages necessary for the ascent operation are applied to the actuators 2 and 2, the actuators 2 and 2 are caused to contract on the outer side (as denoted by sign 101), and to extend on the inner side (as denoted by sign 102). When the actuators 2 and 2 are inclined with those motions, the support blocks 4 and 4 connected to respective one ends of the actuators 2 and 2 are inclined outwards to spread (as denoted by sign 103), and the first arms 5 and 5 coupled respectively to the support blocks 4 and 4 are also inclined outwards to spread (as denoted by sign 104). In other words, upon the application of the voltages, the support blocks 4 and 4 are moved in directions to space away from each other, and the first arms 5 and 5 are also moved in directions to space away from each other.

Upon the application of the voltages, the swing blocks 15 and 15 connected to the respective other ends of the actuators 2 and 2 are also similarly inclined outwards to spread (as denoted by sign 105). With the first arms 5 and 5 inclined outwards to spread, the second arms 6 and 6 joined to the first arms 5 and 5 through the first displacement axes 8 and 8, respectively, are moved toward the outer side obliquely upwards while being pulled by the first arms 5 and 5 (as denoted by sign 106). In other words, upon the application of the voltages, the displacement magnifying mechanism 3 is bent and displaced in such a way that respective gaps of the first notched portions 27 and 27 are narrowed. With those movements of the second arms 6 and 6, the bottom member 7 joined to the second arms 6 and 6 through the second displacement axes 9 and 9, respectively, is moved upwards vertically while being pulled by the second arms 6 and 6 (as denoted by sign 107). In other words, upon the application of the voltages, the displacement magnifying mechanism 3 is bent and displaced in such a way that respective gaps of the second notched portions 28 and 28 are widened. With that vertically upward movement of the bottom member 7, the needle 12 coupled to the bottom member 7 is also moved upwards (as denoted by sign 108). An upward moving amount (denoted by sign 109) of the needle 12 can be changed depending on magnitudes of the voltages applied to the actuators 2 and 2.

(2) Descent Operation

FIG. 5 is an explanatory view referenced to explain the operation of descending the needle 12. In FIG. 5, dotted lines represent positions before voltages are applied to the actuators.

When voltages necessary for the descent operation are applied to the actuators 2 and 2, the actuators 2 and 2 are caused to extend on the outer side (as denoted by sign 110), and to contract on the inner side (as denoted by sign 111). When the actuators 2 and 2 are inclined with those motions, the support blocks 4 and 4 connected to respective one ends of the actuators 2 and 2 are inclined inwards to approach (as denoted by sign 112), and the first arms 5 and 5 coupled respectively to the support blocks 4 and 4 are also inclined inwards to approach (as denoted by sign 113). In other words, upon the application of the voltages, the support blocks 4 and 4 are moved in directions to come closer to each other, and the first arms 5 and 5 are also moved in directions to come closer to each other.

Upon the application of the voltages, the swing blocks 15 and 15 connected to the respective other ends of the actuators 2 and 2 are also similarly inclined inwards to approach (as denoted by sign 114). With the first arms 5 and 5 inclined inwards to approach, the second arms 6 and 6 joined to the first arms 5 and 5 through the first displacement axes 8 and 8, respectively, are moved toward the inner side obliquely downwards while being pushed by the first arms 5 and 5 (as denoted by sign 115). In other words, upon the application of the voltages, the displacement magnifying mechanism 3 is bent and displaced in such a way that the respective gaps of the first notched portions 27 and 27 are widened. With those movements of the second arms 6 and 6, the bottom member 7 joined to the second arms 6 and 6 through the second displacement axes 9 and 9, respectively, is moved downwards vertically while being pushed by the second arms 6 and 6 (as denoted by sign 116). In other words, upon the application of the voltages, the displacement magnifying mechanism 3 is bent and displaced in such a way that the respective gaps of the second notched portions 28 and 28 are narrowed. With that vertically downward movement of the bottom member 7, the needle 12 coupled to the bottom member 7 is also moved downwards (as denoted by sign 117). A downward moving amount (denoted by sign 118) of the needle 12 can be changed depending on magnitudes of the voltages applied to the actuators 2 and 2.

(3) Discharge Operation

In the discharge section 50, the liquid material can be discharged by combining the operations of above (1) and (2). The discharge operation will be described below with reference to FIGS. 3 to 5.

A state where the needle tip 62 is abutted against the valve seat member 56 by the operations of the actuators 2 and 2 and the displacement magnifying mechanism 3 is called an initial state. In the initial state, the discharge hole 58 is closed by the needle tip 62.

When the needle 12 is ascended from the initial state by the ascent operation of above (1) and the needle tip 62 is spaced from the valve seat member 56, the liquid material in the operating space 51 flows through the communication hole 57 of the valve seat member 56 and the discharge hole 58, and then flows out to the outside from the discharge opening 60 at the nozzle end. At this time, the liquid material is in a state in continuation with the discharge opening 60 through a thin string-like portion extending from an edge of the discharge opening. The liquid material in the same amount as the liquid material having flowed out is supplied to the supply flow path 52 of the discharge device 1 through the coupling 54 while passing through the tube 55 from the reservoir (not illustrated).

After the lapse of a predetermined very short time, the needle 12 is descended by the descent operation of above (2), and the needle tip 62 is abutted against the valve seat member 56, whereupon the flow of the liquid material is blocked off and the liquid material flowing out from the discharge opening 60 at the nozzle end is cut off. Because the liquid material is given with inertial force from the needle 12, the liquid material 65 cut off from the discharge opening 60 at the nozzle end is discharged in a flying mode as a liquid droplet.

The above is a basic cycle of one discharge. Such a cycle is repeated when discharging a plurality of liquid droplets in succession.

The liquid droplet can also be discharged from the discharge opening 60 by quickly advancing the needle tip 62 to the vicinity of the valve seat member 56 (i.e., to a position just before seating against it) and giving inertial force to the liquid material instead of causing the needle tip 62 to abut (seat) against the valve seat member 56.

According to the above-described liquid droplet discharge device of Example 1, the desired stroke can be easily set with high accuracy by employing piezoelectric actuators as the actuators to drive the needle 12 in the up-down direction, and by combining the piezoelectric actuators with the U-shaped member that is integrally formed to be free from hinge play. Furthermore, since the number of parts of the U-shaped member is small, minute displacements of the piezoelectric elements can be transmitted at a high speed with high efficiency. Hence a high tact can be realized. Moreover, since the size of the U-shaped member can be reduced, the liquid droplet discharge device having lighter weight and a more compact size can be obtained.

EXAMPLE 2

<Constitution>

Example 2 relates to a liquid droplet discharge device equipped with a displacement magnifying mechanism 3 having a structure different from that in Example 1. The liquid droplet discharge device of Example 2 is different from the liquid droplet discharge device of Example 1, as illustrated in FIG. 6, in that wedge-shaped notches formed at the first displacement axes 8 and 8 and the second displacement axes 9 and 9 of the U-shaped displacement magnifying mechanism 3 are each formed to extend inwards from the outer side when viewed from the front. Stated in another way, in Example 2, four notches disposed at respective upper and lower ends of the second arms 6 and 6 are formed to constitute motion axes (hinges) in a state opened outwards of the U-shaped member (5, 6, 7, 8 and 9) when viewed from the front.

Also in Example 2, the first displacement axes 8 and 8 and the second displacement axes 9 and 9, each serving as the motion axis (hinge), are integrally formed. In other words, the U-shaped member (5, 6, 7, 8 and 9) is not constituted by coupling separate members to each other, and the displacement magnifying mechanism 3 is formed by one member. Therefore, there is no play at the motion axis, and the minute displacements of the piezoelectric elements can transmitted at a high speed with high efficiency. Because two actuators 2, a housing 30, a discharge section 50, etc. are constituted similarly to those in Example 1, description of those components is omitted.

<Operations>

In the case of applying voltages necessary for the ascent operation and the descent operation to the actuators 2 and 2 in the device of Example 2, the displacement magnifying mechanism 3 operates as follows when viewed from the front. When the needle 12 is operated to advance, respective gaps of the notches at the first displacement axes 8 and 8 are narrowed, while respective gaps of the notches at the second displacement axes 9 and 9 are widened. Conversely, when the needle 12 is operated to retract, the respective gaps of the notches at the first displacement axes 8 and 8 are widened, while the respective gaps of the notches at the second displacement axes 9 and 9 are narrowed.

Also in the device of Example 2 including the displacement magnifying mechanism 3 in which the notches are opened in a different direction from that in Example 1, the displacements of the actuators 2 and 2 can be quickly transmitted to the needle 12 with high efficiency by employing the U-shaped member that is integrally formed to be free from hinge play, and similar advantageous effects to those in Example 1 can be obtained.

EXAMPLE 3

<Constitution>

Example 3 relates to a liquid droplet discharge device including four actuators. The liquid droplet discharge device of Example 3 is mainly different from those of Examples 1 and 2, as illustrated in FIG. 7, in that the number of actuators 2 is four, that no notches are formed in the displacement magnifying mechanism 3, and that the swing blocks 15 are not provided. In the following, description of points common to those in Examples 1 and 2 is omitted, and different points are mainly described.

The U-shaped displacement magnifying mechanism 3 is fabricated by bending one plate-like member, and it has first displacement axes 8 and 8 and second displacement axes 9 and 9. The displacement magnifying mechanism 3 of this Example includes no notches that are formed in Examples 1 and 2. Two ends of the U-shaped displacement magnifying mechanism 3 are fixed to support blocks 77 and 78, respectively. The needle 12 is fixed to the second displacement axes 9 of the displacement magnifying mechanism 3.

Two abutment plates 76 are disposed on an upper surface of each of the support blocks 77 and 78. The four abutment plates 76 in total are slidably abutted against four balls 75 that are held at distal ends of four actuators 70 to 73, respectively. The four actuators 70 to 73 are sandwiched between an upper inner surface (ceiling) of the cavity 31 in the housing 30 and the support blocks 77 and 78 that are coupled to four fixation screws 10. More specifically, the actuator A 70 and the actuator B 71 are sandwiched between the first support block 77 and the housing 30, and the actuator C 72 and the actuator D 73 are sandwiched between the second support block 78 and the housing 30.

The four fixation screws 10 are slidably inserted through two through-holes that are formed in the upper portion of the housing 30. While, in this Example, the support blocks 77 and 78 are fixedly held by the four fixation screws 10 in a swingable manner, the number of fixation screws 10 is not limited to four, and it may be, e.g., two or six.

The actuators 70 to 73 used in Example 3 are each constituted by laminating a large number of thin-plate piezoelectric elements into a rectangular parallelepiped shape. A holder 74 for holding the ball 75 is disposed at the distal end (lower end) of each actuator. Each actuator is able to move its surface perpendicular to a lamination direction of the piezoelectric element in the lamination direction (up-down direction) upon application of a voltage. Thus, each holder 74 can also be moved in the up-down direction. While this Example represents, by way of example, the combination of the ball and the abutment plate (plate), the present invention is not limited to that combination.

<Operations>

[1] Ascent Operation (FIG. 8)

FIG. 8 is a front view referenced to explain an operation of ascending the needle 12. In FIG. 8, dotted lines represent positions before voltages are applied to the actuators.

The actuator B 71 and the actuator C 72 are operated to extend by applying the voltages, whereas the actuator A 70 and the actuator D 73 are not operated and allowed to come into a contracted state (with no voltages applied). With those operations, the balls 75 and 75 held by the actuator B 71 and the actuator C 72 are caused to slide on the abutment plates 76 and 76, thus pressing upper inner surfaces of the support blocks 77 and 78, respectively. Accordingly, the first support block 77 and the second support block 78 are inclined such that both the support blocks are spaced from each other, and that the outer side of each support block when viewed from the front ascends and the inner side of each support block when viewed from the front descends. As a result, the first displacement axes 8 and 8 are bent and the second displacement axes 9 and 9 are stretched, whereby the needle 12 is operated to ascend.

[2] Descent Operation (FIG. 9)

FIG. 9 is a front view referenced to explain an operation of descending the needle 12. In FIG. 9, dotted lines represent positions before voltages are applied to the actuators.

The actuator A 70 and the actuator D 73 are operated to extend by applying the voltages, whereas the actuator B 71 and the actuator C 72 are not operated and allowed to come into a contracted state (with no voltages applied). With those operations, the balls 75 held by the actuator A 70 and the actuator D 73 are caused to slide on the abutment plates 76, thus pressing the upper outer surfaces of the support blocks 77 and 78, respectively. Accordingly, the first support block 77 and the second support block 78 are inclined such that both the support blocks come closer to each other, and that the outer side of each support block when viewed from the front descends and the inner side of each support block when viewed from the front ascends. As a result, the first displacement axes 8 and 8 are stretched and the second displacement axes 9 and 9 are bent, whereby the needle 12 is operated to descend.

According to the above-described device of this Example, displacements of the actuators 70 to 73 can be quickly transmitted to the needle 12 with high efficiency through the U-shaped member that is integrally formed to be free from hinge play. Furthermore, the device of this Example is particularly suitable for an operation of discharging a highly-viscous liquid material because a greater amount of energy can be taken out by employing four actuators.

EXAMPLE 4

<Constitution>

Example 4 relates to a liquid droplet discharge device equipped with a displacement magnifying mechanism 3 having a structure different from that in Example 3. The liquid droplet discharge device of Example 4 is different from the liquid droplet discharge device of Example 3, as illustrated in FIG. 10, in that the displacements of the actuators 70 to 73 are transmitted to the first support block 77 and the second support block 78 through four abutment plates 76. In the following, description of points common to those in Example 3 is omitted, and different points are mainly described.

In order to move the needle 12 up and down, the first displacement axes 8 and 8 and the second displacement axes 9 and 9 of the displacement magnifying mechanism 3 need to be displaced by moving two ends of the displacement magnifying mechanism 3 in the left-right direction when viewed from the front. For that purpose, the actuators 70 to 73 are needed to be operated such that the spacing between the first support block 77 and the second support block 78 is widened and narrowed in the left-right direction when viewed from the front. On that occasion, it is optimum that the displacements of the four actuators are utilized only to move the support blocks 77 and 78 in the left-right direction when viewed from the front, and are not utilized to move both the support blocks in different directions. In above Example 3, the balls 75 and the abutment plates 76 serve to transmit the displacements of the four actuators to the support blocks. However, deviations may occur in the front-back direction when viewed from the front because there are no restrictions in the front-back direction when viewed from the front. In view of the above point, the liquid droplet discharge device of this Example is constituted to be able to prevent those deviations in the front-back direction when viewed from the front.

As in Example 3, each of the actuators 70 to 73 includes the holder 74 at its distal end (lower end), and is able to move the holder 74 in the up-down direction upon application of a voltage. However, this Example is different from Example 3 in that an abutment member 79 is disposed at a lower end of the holder 74.

The abutment member 79 has a trapezoidal or triangular shape tapering downwards when viewed from the front. The abutment member 79 may be constituted by fixing a separately fabricated member to the holder 74, or by being formed integrally with the holder 74. A lower end of the abutment member 79 is positioned in a dent 80 and is set to be slidable in the left-right direction when viewed from the front.

FIG. 11 is a sectional view taken along AA in FIG. 10. As illustrated in FIG. 11, the abutment member 79 has a uniform width from an upper end to a lower end thereof when viewed from a side, and a motion of the abutment member 79 in the front-back direction when viewed from the front is restricted by the dent 80 having substantially the same width as the abutment member 79. Accordingly, the displacements of the actuators will not appear in the support blocks 77 and 78 as motions in the front-back direction when viewed from the front, and those displacements of the actuators are all utilized as motions in the left-right direction when viewed from the front.

The dent 80 is formed in an upper surface of each of the support blocks 77 and 78, and it is a groove having a rectangular shape when viewed from the side. As illustrated in FIG. 11, the width of the dent 80 in the left-right direction when viewed from the side is set to such a value as restricting a deviation of the abutment member 79 in the left-right direction when viewed from the side (i.e., in the front-back direction when viewed from the front), but not impeding movement of the abutment member 79 in the front-back direction when viewed from the side (i.e., in the left-right direction when viewed from the front).

The four abutment plates 76 are disposed at bottom surfaces of the dents 80 in an opposing relation to the actuators, respectively.

<Operations>

Operations of ascending and descending the needle 12 are similar to those in Example 3.

As illustrated in FIG. 8, the actuator B 71 and the actuator C 72 are operated to extend by applying the voltages, and the actuator A 70 and the actuator D 73 are not operated (with no voltages applied), whereby the needle 12 is operated to ascend.

As illustrated in FIG. 9, the actuator A 70 and the actuator D 73 are operated to extend by applying the voltages, and the actuator B 71 and the actuator C 72 are not operated (with no voltages applied), whereby the needle 12 is operated to descend.

According to the liquid droplet discharge device of this Example constituted as described above, since the displacements of the actuators can be magnified by the displacement magnifying mechanism 3 without loss, the needle 12 can be operated to reciprocate with high efficiency and high accuracy.

The invention claimed is:

1. A liquid droplet discharge device including a liquid chamber that is communicated with a discharge opening, and that is supplied with a liquid material, a needle having a tip that is advanced and retracted within the liquid chamber, a drive device that operates the needle to advance and retract, and a displacement magnifying mechanism, the liquid droplet discharge device discharging liquid droplets from the discharge opening, wherein the drive device is constituted by an even number of drive devices disposed in a left-right symmetric relation, the displacement magnifying mechanism includes an elastically deformable U-shaped member having a bottom portion to which the needle is coupled, and the drive devices operate the needle to retract by applying forces acting to move the two ends of the U-shaped member away from each other, and to advance by applying forces acting to move the two ends of the U-shaped member closer to each other.

2. The liquid droplet discharge device according to claim 1, wherein the drive devices move the two ends of the U-shaped member away from each other by pressing inner sides of the two ends of the U-shaped member downwards or pulling outer sides of the two ends thereof upwards, and move the two ends of the U-shaped member closer to each other by pressing the outer sides of the two ends of the U-shaped member downwards or pulling the inner sides of the two ends thereof upwards.

3. The liquid droplet discharge device according to claim 2, wherein the U-shaped member includes arms having first and second displacement axes that are disposed symmetric with respect to a center line in a vertical direction.

4. The liquid droplet discharge device according to claim 3, wherein the arms are integrally-formed arms.

5. The liquid droplet discharge device according to claim 3, wherein the U-shaped member includes two first arms connected to the drive devices;
two second arms joined to the two first arms through first notched portions, respectively, and
a bottom member joined to the two second arms through second notched portions, respectively,
wherein the first notched portions constitute the first displacement axes, and
the second notched portions constitute the second displacement axes.

6. The liquid droplet discharge device according to claim 1, wherein the drive devices are each a piezoelectric actuator.

7. The liquid droplet discharge device according to claim 6, wherein each of the drive devices is connected to the U-shaped member through a coupling member that allows a lower end of the drive device to slide in a left-right direction, and that restricts movement of the drive device in a front-back direction.

8. The liquid droplet discharge device according to claim 1, wherein the drive devices are constituted by a first drive device arranged on a leftmost side, a second drive device arranged adjacent to the first drive device, a third drive device arranged adjacent to the second drive device, and a fourth drive device arranged on a rightmost side,
the first and second drive devices are coupled to one end of the U-shaped member through a first coupling member,
the third and fourth drive devices are coupled to the other end of the U-shaped member through a second coupling member,
the second drive device and the third drive device are operated when the needle is moved to retract, and
the first drive device and the fourth drive device are operated when the needle is moved to advance.

9. An application apparatus including the liquid droplet discharge device according to claim 1, a work table on which an application object is placed, a relatively moving device that moves the liquid droplet discharge device and an application object relatively to each other, and a liquid material supply source that supplies a liquid material to the liquid droplet discharge device.

10. An application apparatus including the liquid droplet discharge device according to claim 8, a work table on which an application object is placed, a relatively moving device that moves the liquid droplet discharge device and the application object relatively to each other, and a liquid material supply source that supplies a liquid material to the liquid droplet discharge device.

11. The liquid droplet discharge device according to claim 4, wherein the U-shaped member includes two first arms connected to the drive devices;
two second arms joined to the two first arms through first notched portions, respectively, and
a bottom member joined to the two second arms through second notched portions, respectively,
wherein the first notched portions constitute the first displacement axes, and
the second notched portions constitute the second displacement axes.

12. The liquid droplet discharge device according to claim 2, wherein the drive devices are each a piezoelectric actuator.

13. The liquid droplet discharge device according to claim 3, wherein the drive devices are each a piezoelectric actuator.

14. The liquid droplet discharge device according to claim 4, wherein the drive devices are each a piezoelectric actuator.

15. An application apparatus including the liquid droplet discharge device according to claim 2, a work table on which an application object is placed, a relatively moving device that moves the liquid droplet discharge device and an application object relatively to each other, and a liquid material supply source that supplies a liquid material to the liquid droplet discharge device.

16. An application apparatus including the liquid droplet discharge device according to claim 3, a work table on which an application object is placed, a relatively moving device that moves the liquid droplet discharge device and an application object relatively to each other, and a liquid material supply source that supplies a liquid material to the liquid droplet discharge device.

17. An application apparatus including the liquid droplet discharge device according to claim 4, a work table on which an application object is placed, a relatively moving device that moves the liquid droplet discharge device and an application object relatively to each other, and a liquid material supply source that supplies a liquid material to the liquid droplet discharge device.

\* \* \* \* \*